(12) United States Patent
Caplet

(10) Patent No.: US 6,878,566 B2
(45) Date of Patent: Apr. 12, 2005

(54) METHOD OF REINFORCING A MECHANICAL MICROSTRUCTURE

(75) Inventor: Stéphane Caplet, Sassenage (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 10/330,644

(22) Filed: Dec. 27, 2002

(65) Prior Publication Data

US 2003/0166310 A1 Sep. 4, 2003

(30) Foreign Application Priority Data

Dec. 28, 2001 (FR) .......................................... 01 17014

(51) Int. Cl.[7] .............................................. H01L 21/00
(52) U.S. Cl. ..................... 438/52; 438/456; 257/29.324
(58) Field of Search .............................. 438/48, 51, 52, 438/FOR 412, FOR 432, FOR 438, 456; 148/DIG. 12; 257/E29.324

(56) References Cited

U.S. PATENT DOCUMENTS

| 6,136,631 A | * 10/2000 | Mueller et al. ............... 438/52 |
| 6,156,586 A | * 12/2000 | Kolb ........................... 438/52 |
| 6,225,145 B1 | 5/2001 | Choi et al. | |

FOREIGN PATENT DOCUMENTS

| FR | 2 785 449 | 10/1998 |
| WO | WO 95/17014 | 6/1995 |
| WO | WO 95/33282 | 12/1995 |

OTHER PUBLICATIONS

Paper, "A Monolithic Fully–Integrated Vacuum–Sealed CMOS Pressure Sensor," A.V. Chavan [1] and K.D. Wise[2], Center for Integrated MicroSystems, The University of Michigan, Ann Arbor, Michigan and IC Design Center, Delphi Delco Electronic Systems, Kokomo, Indiana.

* cited by examiner

Primary Examiner—George Fourson
Assistant Examiner—Thanh V Pham
(74) Attorney, Agent, or Firm—Brinks Hofer Gilson & Lione

(57) ABSTRACT

A mechanical microstructure including a deformable first layer overhanging a second layer and defining a cavity set back from an external face of the deformable first layer and having an abutment stud projecting into the cavity, in which a wire is connected to a portion of an internal face of the deformable first layer. The portion of the first layer is opposite a bottom area of the cavity into which the abutment stud projects, but the abutment stud remains at a distance from the deformable first layer. A method of producing the mechanical microstructure is also disclosed.

15 Claims, 2 Drawing Sheets

METHOD OF REINFORCING A MECHANICAL MICROSTRUCTURE

This application claims priority under 35 U.S.C. §119 to French patent application No. 0117014, filed Dec. 28, 2001.

TECHNICAL FIELD

The present invention relates to method of producing a mechanical microstructure and to a mechanical microstructure having an electrically active portion. This kind of microstructure can advantageously constitute sensor, for example a pressure sensor, or an actuator, for example an optical microsystem (MOEMS). It has a preferred, but not exclusive, application in the field of inertial components, such as accelerometers.

BACKGROUND

The commonly assigned French patent FR 2,558,263 discloses the fabrication of micromechanical devices by microelectronic techniques. These methods produce a microstructure, which is defined as a mechanical structure produced using microelectronic techniques, that is to say collective processing of substrates by deposition, etching, photolithography, etc.

In the case of accelerometers, the electrically active portion can be partly carried by a mobile member, and in this case acceleration is measured by measuring a variation in the electrical capacitance between the mobile member and a fixed portion of the mechanical microstructure, for example.

The above kind of microstructure can include a cap to confine the active portion, as disclosed in particular in the commonly assigned French patent FR 2,770,339.

During this development process, the inventors were first confronted with the problem of stray capacitances appearing between the active portion and the cap. It is necessary to reduce the stray capacitances, especially if a highly sensitive sensor is required.

To this end, and in accordance with a first feature of the invention disclosed in FR 2,770,339, the inventors formed a recess in the cap, vertically aligned with and at a predetermined distance from the active portion.

The predetermined distance is in particular sufficient to limit or even prevent the appearance of the stray capacitance previously cited.

Furthermore, and as explained in the French patent FR 2,770,339, the electrically active portion can be produced in a layer formed on a substrate including one or more holes opening onto an internal face of the layer, through which an electrical contact is made with the electrically active portion on the internal face of the layer.

The electrical contact can be made with a metal deposit, for example using an ultrasound welding technique known to the person skilled in the art.

The inventors of the subject matter disclosed in FR 2,770,339 were confronted with problems related to the small thickness of the layer in which the active portion is produced (for example 60 $\mu$m); and more particularly to its great fragility.

During their research, they found that deterioration could occur, especially at the moment of producing the electrical contact with the internal face of the layer, as, if the external face of the layer is facing the cavity, the ultrasound vibration combined with the pressure of the welding device is likely to lead to rupturing of the thin layer, because it is very fragile.

They further found that providing too great a predetermined distance, in accordance with the first feature of the invention referred to above, was likely to encourage such rupturing, as it is difficult if not impossible to arrive at a compromise between minimizing the stray capacitances and avoiding rupture.

BRIEF SUMMARY

To address the foregoing problem, the present invention is directed to a method of producing a mechanical microstructure including a deformable first layer overhanging a second layer including a cavity set back from an external face of the deformable first layer, in which method a wire is connected to a portion of an internal face of the deformable first layer.

According to one aspect of the invention, the aforementioned portion faces a bottom area in the cavity into which an abutment stud projects and is at a distance from the deformable first layer.

Thanks to these features, the invention overcomes the drawbacks previously cited. This is because:
first, thanks to the localized character of the abutment stud, the recess in vertical alignment with the first layer is at a predetermined distance sufficient to prevent the formation of stray capacitances between the first layer and the second layer, and
second, because of the vertical alignment with the connecting portion and because the distance between the first layer and the second layer is reduced, without being reduced to zero, the abutment stud limits deformation of the thin first layer during welding, which prevents local damage to the layer.

According to a first feature, the microstructure further includes a support layer for said first layer and in the course of the method according to invention a well is formed in the support opening opposite the portion of the internal face of the first layer and the wire is connected to the first layer via the well.

According to another feature, after the step of forming the well, a localized contact layer is deposited on the bottom of well and said connection between the connecting wire and said first layer is made by means of the contact layer.

Thus the connection can be obtained using the Ball Bonding technique.

The present invention also provides a mechanical microstructure including a deformable first layer overhanging a second layer including a cavity set back from an external face of the deformable first layer and includes a portion to which is connected a wire.

According to another aspect of the invention, the aforementioned portion is opposite a bottom area of the cavity into which an abutment stud projects remains at a distance from the deformable first layer.

According to one particular feature the microstructure includes an insulative layer between the first layer and the support layer and the insulative layer includes an undercut under the edges of the well.

This feature is particularly advantageous because it guarantees that there is an electrical discontinuity between any deposit on a wall of the well and the localized contact layer.

BRIEF DESCRIPTION OF THE DRAWING

Other aspects and advantages of the present invention will become more clearly apparent on reading the following description of particular embodiments, which description is given by way of nonlimiting example only and with reference to the accompanying drawings, in which.

DETAILED DESCRIPTION

Figure 1:
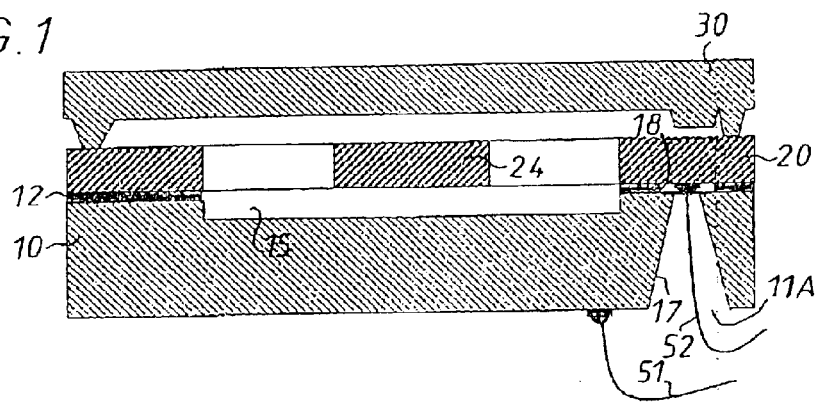
FIG. 1 illustrates a geophone microstructure in accordance with the invention nearing completion.

FIG. 1 shows a geophone microstructure approaching completion and having at least the following three main portions: a central layer 20 including a mobile mass 24 sensitive to the accelerations to be detected by the geophone, a support layer 10 that carries the central portion, and a top layer 30, which covers the central layer and defines with the support layer 10, an enclosure that can be evacuated if necessary.

In a preferred embodiment, each layer is made from a silicon substrate.

One or more of the substrates can instead be made from a different material.

Each substrate can initially have the same characteristics and in particular the same thickness, for example 450 µm.

In a preferred embodiment, the top layer 30 corresponding to the top portion is 300 µm thick.

However, since, in a geophone, the central layer must in principle have a much smaller final thickness (it is referred to as a thin layer), it is necessary, prior to the specific steps that produce the required microstructure, to reduce the thickness of the central layer 20 to obtain a layer a few tens of microns thick, for example.

In a preferred embodiment of the invention, the final thickness of the central layer 20 is of the order of about 60 microns.

The central layer can be obtained by any appropriate means known in the art, for example by etching the surplus portion of the substrate.

The production of the above kind of microstructure is described briefly next.

The support layer 10 is first coated with a discontinuous oxide layer 12 which is applied to the portions of the face of the support layer 10 intended to be attached to the central layer 20.

The oxide layer 12 is preferably made from the same material as the support layer 10, for example, both can be silicon oxide.

The central layer 20 is then attached to the support layer 10, in which a cavity 15 has been formed, for example by etching through a mask (not shown).

The thin layer is preferably transferred to the support layer 10 using a vacuum $Si/SiO_2$ molecular bonding technique. Here, the oxide layer 12 provides insulation between the central layer and the support layer 10. In this bonding technique, subsequent annealing at a high temperature, for example about 1100° C. (see below), strengthens the attachment.

After the bonding and annealing operations, the central layer 20 is thinned by mechanical-chemical machining and/or by chemical etching to obtain a layer 20 of the required thickness.

The support layer 10 is etched completely through its thickness at the location of an opening 11A to form a well 17 for making an electrical contact.

In this example the etching is anisotropic etching using KOH, producing a well 17 with a section that decreases in size toward the top or, more specifically, toward the central layer 20.

The etching, in practice using a chemical etching technique (for example employing hydrofluoric acid HF), continues through the oxide layer 12, which produces an undercut 18 in the oxide layer 12 under the edges of the well 17, and therefore vertically aligned therewith vis a vis the thin layer.

Figure 2:
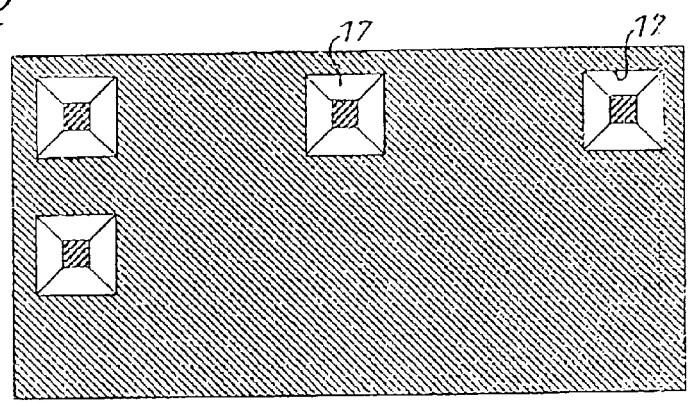
FIG. 2 illustrates a bottom view of a different embodiment in accordance with the invention of the microstructure shown in FIG. 1.

As can be seen in FIG. 2, there is advantageously a plurality of contact wells 17, the number of wells being defined as a function of the number of connections to be made to the thin layer (there is thus an equal number of openings). In this example the wells are identical and have a square section.

Using a mask, not shown, a portion 23 (structure) is then cut into the central layer 20, for instance by dry etching (for example Deep Reactive Dry Etching (DRIE)), so as to mechanically and electrically trim the structure, which after this etching is freed with respect to the remainder of the thin layer and the remainder of the whole.

Figure 3:
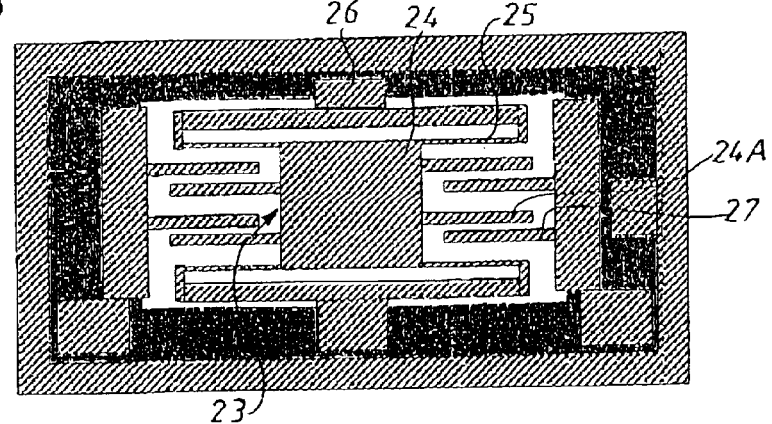
FIG. 3 illustrates a plan view of a second substrate in accordance with the invention after freeing a sensitive portion.

As shown in FIG. 3, the structure obtained in this example has a central layer 24 connected to the edges of the cavity by supporting beams 25 which act as return springs and which are connected to two anchor studs 26.

Cantilever beams 24A near the fixed cantilever beams 27 are fastened to this central mass by virtue of a capacitive effect, the cantilevered beams measure the amplitude of movement of the central portion in response to acceleration. For more information on this, the reader may refer to FR 2,558,263 referred to above.

Top layer 30, forming a cap, is then placed over the central layer 20, which is itself placed on the support layer 10.

The top layer 30 can be attached to, the combination of the central layer 20 and the support layer 10 using, for example, a eutectric attachment technique known in the art and not described here.

After the three layer 10, 20 and 30 shown in FIG. 1 have been fastened together, provision is made for connecting the active portion to the outside world.

Thus, FIG. 1 shows the above combination after fixing connecting wires 51 and 52, one of which is connected to the exterior surface of the support layer 10 and the other of which is fixed at the bottom of a well 17.

Figure 4:
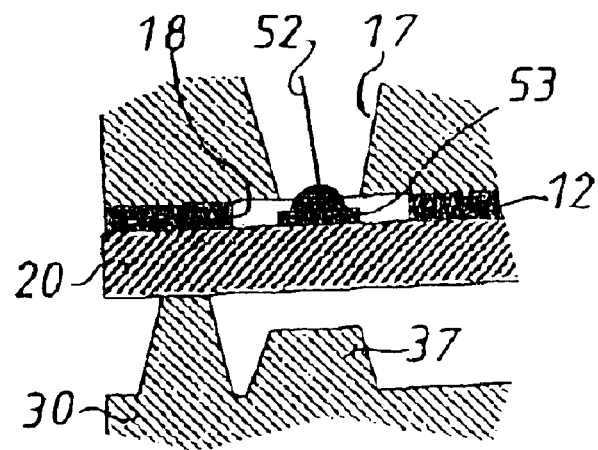
FIG. 4 illustrates an enlarged view of the microstructure from FIG. 1 in accordance with the invention, after turning it over for fixing an electrical connection.

As can be seen in FIG. 4, the connection at the bottom of the well 17 is advantageously made after depositing a localized contact layer 53.

This layer can be produced by using the walls of the well as a mask, for example, in which case the localized contact layer shown in this Figure has the same section as the bottom portion of the well.

The existence of a deposit on the walls of this well is not a problem because the undercut 18 in the oxide layer 12 guarantees that there is a discontinuity between any deposit on this wall and the localized layer.

In practice, electrical contacts are made to the thin layer in an area outside the opening within which the central portion moves.

However, the thin layer, which is built-in but overhanging the location concerned, may not be rigid enough to resist the thrust forces deployed in welding a wire to the localized area. In the FIG. 4 configuration, these thrust forces are directed downward.

Preferably, a stud 37 is included in the top layer 30 specifically to prevent these thrust forces from damaging the central layer 20. A stud 37 is located in the third substrate 30 opposite to each area of the central layer in which a weld must be made.

Thus, the stud 37 constitutes an abutment that limits deformation of the central layer during the welding operation to minimize damage to the central layer. The welding operation can therefore be carried out in total safety, for example using a ball bonding technique.

Figure 5:
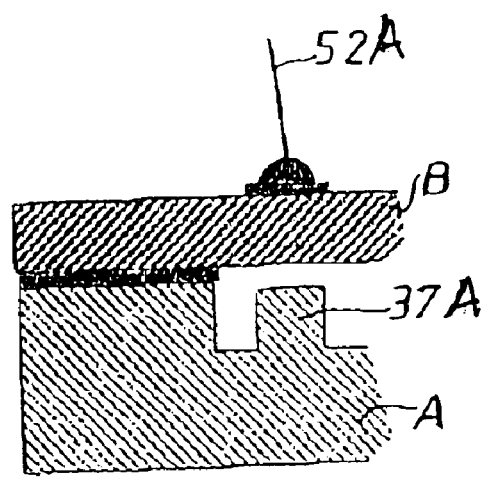
FIG. 5 illustrates a diagrammatic general view in accordance with the invention of a substrate supporting a thin layer to which an electrical connection is made in an overhanging area.

FIG. 5 shows the general principle of making this connection: a connecting wire 52' is advantageously connected to a deformable layer portion B overhanging a support A including a cavity opposite a bottom area of the cavity into which an abutment stud 37' projects, although the stud remains at a distance from the layer.

The distance of the abutment stud 37 or 37' from the central layer depends on the build-in distance and, in this example, is advantageously of the order of few microns.

The foregoing description applies to geophones and to various other systems or microstructures in which there is a need to connect a thin layer overhanging a substrate. The connection to the contact studs is advantageously made by means of wells and abutment studs as described hereinabove.

What is claimed is:

1. A method of producing a mechanical microstructure comprising a deformable first layer overhanging a second layers, the second layer comprising a cavity set back from an external face of said deformable first layer, the method comprising connecting a wire to a portion of an internal face of said deformable first layer, wherein said internal face resides in a plane across said cavity, and forming an abutment stud in a bottom area of said cavity such that said abutment stud projects into said cavity while remaining at a distance from said deformable first layer.

2. A method of producing a mechanical microstructure according to claim 1, wherein said microstructure further comprises a support layer for said deformable first layer, and wherein said method further comprises:
   forming a well in said support layer opening opposite said portion of the internal face of said first layer,
   wherein said wire is connected to said internal face of said first layer through said well.

3. A method of producing a mechanical microstructure according to claim 2 further comprising, after said step of forming a well, forming a localized contact layer on a bottom of said well, wherein connection between said connecting wire and said first layer is made by means of said contact layer.

4. A method of producing a mechanical microstructure comprising:
   forming a microstructure comprising a deformable central layer positioned between a support layer and a top layer, wherein the deformable central layer comprises a planar layer bonded to the support layer and a mobile mass cantilevered over a cavity, and wherein the top layer includes an abutment stud projecting into the cavity extending toward but spaced apart from an external face of the deformable central layer;
   forming an opening in the support layer to expose an internal face portion of the deformable central layer; and
   bonding a wire to the internal face portion, wherein the internal face portion is generally opposite to the abutment stud, and wherein the abutment stud provides mechanical support to the deformable central layer during bonding.

5. The method of producing a mechanical microstructure according to claim 4 further comprising forming an oxide layer on the internal face.

6. The method of producing a mechanical microstructure according to claim 5 further comprising forming an opening in the oxide layer using the opening in the support layer as a mask.

7. The method of producing a mechanical microstructure according to claim 6 further comprising forming a localized contact layer on the internal face portion.

8. The method of producing a mechanical microstructure according to claim 4, wherein forming a microstructure comprises:
   forming the support layer by providing a first substrate and coating a surface of the substrate with an oxide layer and forming a cavity in surface of the first substrate;
   forming the deformable central layer by bonding a second silicon substrate to the surface of first substrate and thinning the second substrate; and
   forming the top layer by attaching a third substrate to the second substrate.

9. The method of producing a mechanical microstructure according to claim 8, wherein bonding a second substrate to the surface of first substrate comprises vacuum molecular bonding.

10. The method or producing a mechanical microstructure according to claim 8, wherein thinning the second substrate comprises chemical mechanical polishing a surface of the second substrate.

11. The method of producing a mechanical microstructure according to claim 8, wherein forming the deformable central layer further comprises dry etching the second substrate to form the mobile mass.

12. The method of producing a mechanical microstructure according to claim 11, wherein forming the deformable central layer further comprises dry etching the second substrate to form support beams connected to the mobile mass at a first end and connect to anchor studs at a second end.

13. The method of producing a mechanical microstructure according to claim 11, wherein dry etching comprises deep reactive dry etching.

14. The method of producing a mechanical microstructure according to claim 4, wherein forming an opening comprises in the support layer anisotropically etching the support layer to form an opening having a tapered sidewall, such that the width of the opening decreases with depth.

15. The method of producing a mechanical microstructure according to claim 14, wherein forming an opening comprises forming a plurality of openings in the support layer, and wherein the openings have a substantially square cross section.

* * * * *